United States Patent [19]
Luque

[11] Patent Number: 5,764,667
[45] Date of Patent: Jun. 9, 1998

[54] CURRENT STEERING CIRCUIT

[75] Inventor: Phillip R. Luque, Boise, Id.

[73] Assignee: Hewlett-Packard Company, Palo Alto, Calif.

[21] Appl. No.: 762,463

[22] Filed: Dec. 9, 1996

[51] Int. Cl.$^6$ ........................................... H01S 3/00
[52] U.S. Cl. ........................................... 372/38
[58] Field of Search ............................ 372/38; 235/492; 358/465, 482, 494

[56]                References Cited
U.S. PATENT DOCUMENTS

| | | | |
|---|---|---|---|
| 4,412,331 | 10/1983 | Chapman | 372/38 |
| 4,709,370 | 11/1987 | Bednarz et al. | 372/38 |
| 4,806,803 | 2/1989 | Yamashita | 307/571 |
| 5,199,039 | 3/1993 | Raper | 372/38 |
| 5,214,527 | 5/1993 | Chang et al. | 372/38 |
| 5,218,612 | 6/1993 | Wandel | 372/38 |
| 5,243,613 | 9/1993 | Gysel et al. | 372/38 |
| 5,319,656 | 6/1994 | Geller | 372/38 |
| 5,438,581 | 8/1995 | Reele | 372/38 |
| 5,444,728 | 8/1995 | Thompson | 372/38 |
| 5,598,040 | 1/1997 | Markis | 372/38 |
| 5,651,017 | 7/1997 | Genovese | 372/38 |

*Primary Examiner*—Brian Healy
*Assistant Examiner*—Robert E. Wise
*Attorney, Agent, or Firm*—Gregg W. Wisdom

[57]                ABSTRACT

A current steering circuit accomplishes high speed switching of drive current through a vertical cavity surface emitting laser (VCSEL) diode. The preferred embodiment of the current steering circuit includes a first and second schottky diode, connected anode to anode, as the circuit elements used to steer the current that flows into the common connection point of the schottky diodes. The cathode of the first schottky diode is connected to the anode of the VCSEL diode. The cathode of the second schottky diode is connected to one side of a network formed from three resistors. The other side of the network is connected to the output of a CMOS invertor used to buffer the video signal which controls the steering of the current. With the output of the CMOS invertor at a high level, the second schottky diode is in the off state and the first schottky diode is in the on state, forcing drive current to flow through the VCSEL diode. With the output of the CMOS invertor at a low level, the first schottky diode is in the off state and the second schottky diode is in the on state, forcing drive current to bypass the VCSEL diode.

16 Claims, 5 Drawing Sheets

CURRENT STEERING CIRCUIT

CROSS REFERENCE TO A RELATED APPLICATION

This application includes subject matter related to a co-pending application entitled "COMPENSATION FOR LASER DIODE OUTPUT POWER VARIATION", having patent application docket number 10960126-1, assigned to the same assignee as this patent application, and incorporated by reference herein.

FIELD OF THE INVENTION

The present invention relates generally to the switching of current, and, more specifically, to a circuit which allows high speed switching of drive current for a vertical cavity surface emitting laser diode.

BACKGROUND OF THE INVENTION

Shown in FIG. 1 is a simplified diagram of the layout of the photoconductor drum exposure system in a laser printer. The drum exposure system of a laser printer shown in FIG. 1 is well known by those of ordinary skill in the art of electrophotographic printer design and so will be discussed in only a rudimentary manner. Further information regarding photo-conductor drum exposure systems can be found in "The Physics and Technology of Xerographic Processes", by Edgar M. Williams, 1984, a Wiley-Interscience Publication of John Wiley & Sons, the disclosure of which is hereby incorporated by reference. Rotating scanning mirror 1 sweeps a laser beam 2 across the width of a photoconductor drum 3. The laser beam 2 is pulsed to selectively expose the surface of the photo-conductor drum 3 in a line by line manner as the photo-conductor drum 3 rotates, thereby creating a latent electrostatic image onto which toner is developed. Although the drum exposure system of FIG. 1 operates with a single laser beam 2, one of ordinary skill in the art will understand that this layout of photo-conductor drum exposure system is useful for a multiple beam exposure system.

A portion of the cone of light 4 emitted from laser diode 5 is passed through collimating lens 6 to form laser beam 2. The cross sectional profile of the laser beam 2 is gaussian in both the horizontal and vertical dimensions of the beam width. To ensure uniform development of the latent electrostatic image, it is important to maintain uniformity of the surface voltage of the photoconductor drum in the exposed areas. To achieve the necessary degree of surface voltage uniformity, it is necessary to tightly control the sensitivity of the photo-conductor drum 3 and the power of the laser beam 2 across the length of the photo-conductor drum 3.

A switching circuit drives the laser diode 5, to control the pulsing of the laser beam 2. The smallest area on the surface of the photo-conductor drum 3 which can be exposed forms a pixel element. The printing resolution is limited by the size of the pixel element. High resolution printing requires rapid switching of the laser diode from the off state to the on state and the on state to the off state to create the smallest possible pixel element. The rate at which rotating scanner mirror 1 sweeps laser beam 2 across photo-conductor drum 3 limits the printing speed of the laser printer. A higher sweep rate permits a higher rotation rate of photo-conductor drum 3 and thereby results in a higher printing speed. However, for a fixed switching time for the laser source, there is a compromise between the printing speed and the resolution. Reducing the time necessary to switch the laser diode between the off state and the on state increases the maximum printing resolution if the laser beam 2 sweep rate is held constant or increases the printing speed if the printing resolution is held constant.

If multiple laser beams are swept across a photoconductor drum using a single scanner mirror, it is possible to increase the printing speed and/or the resolution without requiring an increase in the rotational rate of the scanner mirror. A laser printer design using multiple laser beams has the potential for providing a significant improvement in performance without a comparable increase in cost. However, multiple independent laser beams require multiple laser diodes. It is possible to fabricate multiple vertical cavity surface emitting laser (VCSEL) diodes on a single substrate. If the multiple VCSEL diodes are fabricated in a common cathode configuration, they offer a substantial cost savings over a comparable arrangement of edge emitting laser diodes. However, because of the type of substrate material used, multiple VCSEL diodes fabricated in a common anode configuration are less reliable and considerably more expensive than the common cathode configuration. Therefore, there is a strong preference for using common cathode VCSEL diodes in multiple beam laser printers.

A number of different circuit configurations have been implemented to accomplish switching of laser diodes. For those laser printers having relatively low resolution and low rates of printing, configurations which use transistors switching between the cutoff region and the saturation region to control the flow of current through the laser diode provide acceptable performance. Generally, because of their greater switching speed, NPN transistors are used instead of PNP transistors. For more demanding applications, it is necessary to use high speed switching circuit configurations that prevent the switching transistors from entering saturation.

One such high speed current steering circuit configuration uses PNP transistors to source current into the anode of the laser diode 5 with the cathode of the laser diode 5 connected to ground. Shown in FIG. 2 is a topology for this high speed current steering circuit using PNP transistors 10, 11 to steer drive current into or around laser diode 5 depending upon the drive signal at the base of PNP transistor 10. Using an emitter coupled pair of PNP transistors 10, 11, each alternately switching between the linear region and the cutoff region, provides improved performance over circuit configurations which use a NPN transistor switching between the cutoff region and the saturation region. The current steering circuit configuration of FIG. 2 could be used to provide drive current to multiple vertical cavity surface emitting laser diodes in a common cathode configuration. However, the switching performance of the current steering circuit is limited by the use of the PNP transistors. In many IC processes, high speed PNP transistors are either not available or are expensive to fabricate. There is an unmet need for a simple, low cost, high speed current steering circuit configuration that is compatible for use with common cathode laser diode arrays.

SUMMARY OF THE INVENTION

A current steering circuit allows a current to be rapidly steered into and around a load, such as a laser diode, in response to the state of an output of a signal source. The load includes a first terminal and a second terminal. The signal source may be, for example, a video signal in a laser printer. The current steering circuit includes a first diode having a first anode and a first cathode with the first anode connected to a second anode of a second diode. The first and second diodes may each be, for example, schottky diodes to achieve high speed switching. The first cathode of the first diode is connected to the first terminal of the load. The steering circuit further includes a first, a second, and a third resistor. The first resistor is connected between a second cathode of the second diode and the second terminal of the load. The second resistor is connected between the second cathode and a predetermined voltage, such as a five volt supply. The third resistor is connected between the second cathode and the signal source.

When the signal source is at a low level, the network formed by the first, second, and third resistors establishes a voltage at the second cathode so that the first diode is in the off state and the second diode is in the on state. As a result, the current is steered around the load and through the first and third resistors. When the signal source is at a high level, the network formed by the first, second, and third resistors establishes a voltage at the second cathode so that the first diode is in the on state and the second diode is in the off state. As a result, the current is steered into the first terminal of the load. By changing the output from the low state to the high state or the high state to the low state, current is rapidly steered into and around the load.

BRIEF DESCRIPTION OF THE DRAWINGS

A more thorough understanding of the invention may be had from the consideration of the following detailed description taken in conjunction with the accompanying drawings in which.

DETAILED DESCRIPTION OF THE PREFERRED EMBODIMENT

The present invention is not limited to the specific exemplary embodiments illustrated herein. Although the description of the preferred embodiment of the current steering circuit will be discussed in the context of an array of common cathode array VCSEL diodes, one of ordinary skill in the art will recognize from understanding this disclosure that the current steering circuit is useful for high speed switching of drive current for any laser diode. Furthermore, the current steering circuit is useful for high speed switching of current to any low inductance load.

Figure 1:
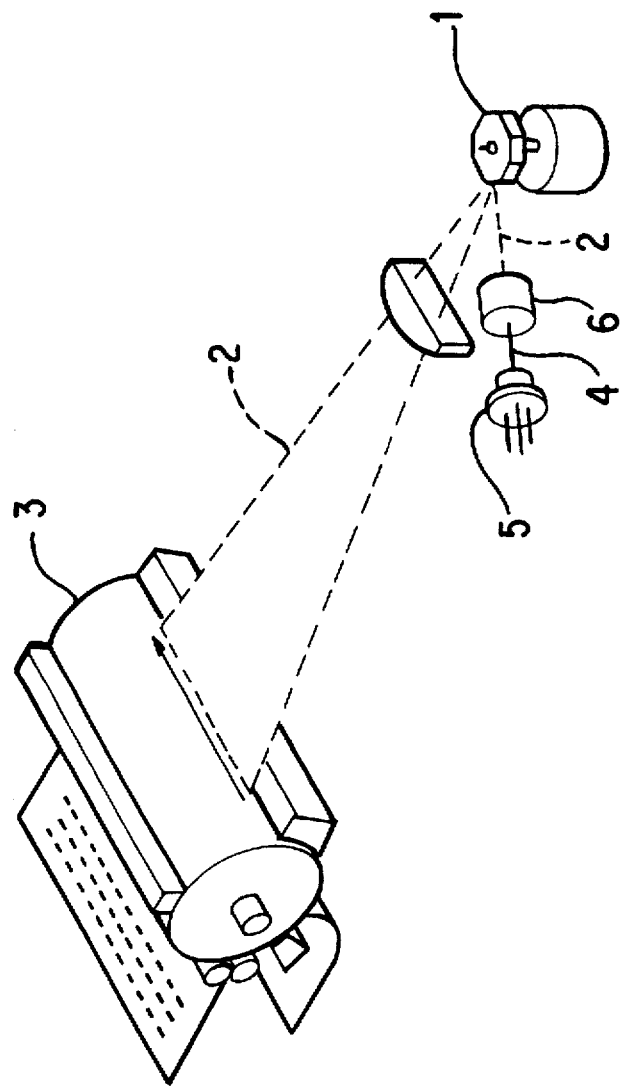
FIG. 1 is a simplified representation of the basic elements of the exposure system in an electrophotographic printer.
Figure 2:
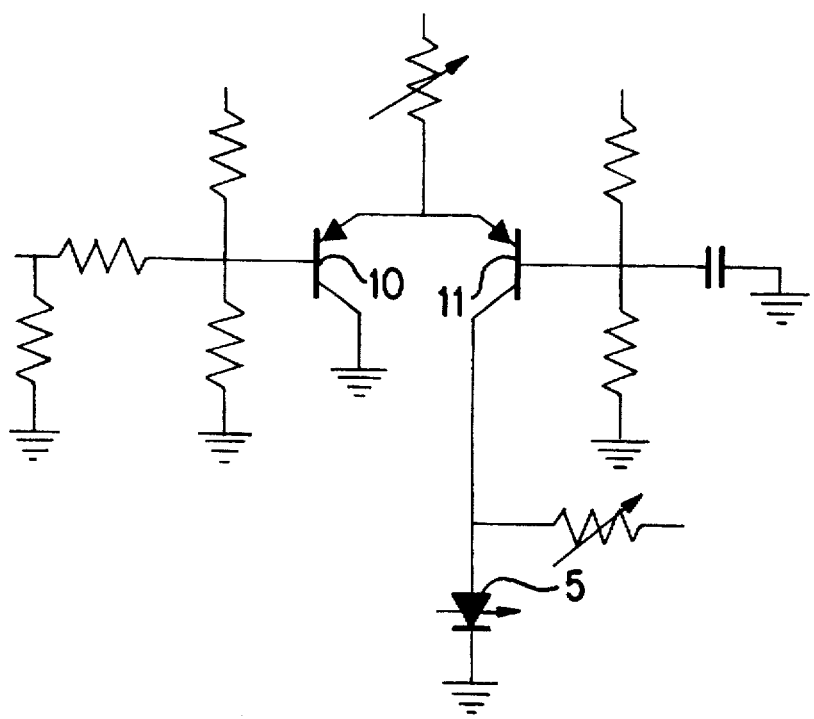
FIG. 2 is a steering circuit configuration for common cathode laser diodes using PNP transistors.
Figure 3:
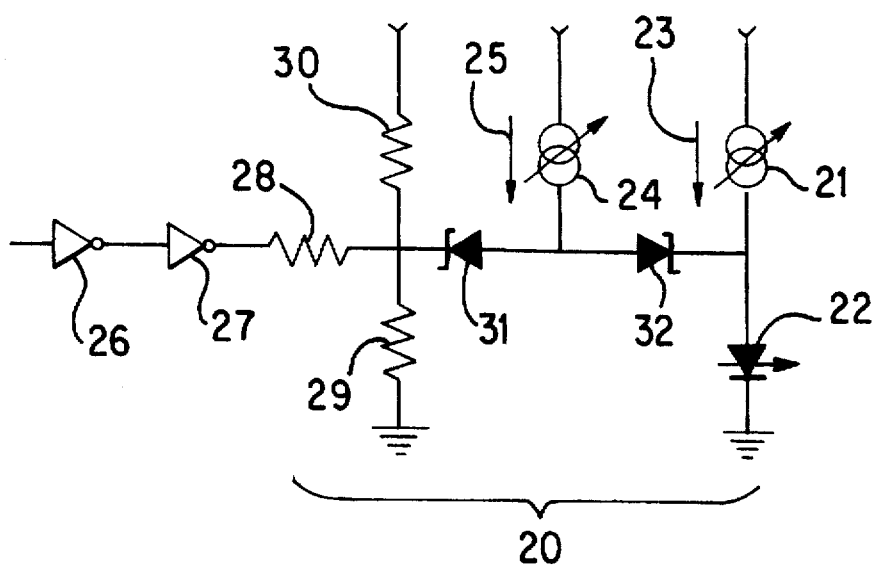
FIG. 3 is a simplified schematic of the preferred embodiment of a current steering circuit.

Shown in FIG. 3 is a simplified schematic of the current steering circuit 20. The bias current source 21 maintains a current through the VCSEL diode 22 slightly below the threshold level during the time in which the optical output of the VCSEL diode 22 is substantially zero. The term "substantially zero", as it is used to describe the output power of the VCSEL diode 22, refers to the output power of the VCSEL diode 22 remaining at or below the maximum output power to the left of the knee of the output power versus diode forward current curve. Providing a bias current 23 slightly below the threshold current allows switching of the VCSEL diode 22 to be performed more rapidly than would be the case if all the forward current through the VCSEL diode 22 were switched synchronously with the drive signal. However, it should be recognized that this current steering circuit could be used for the case in which all of the forward current through VCSEL diode 22 is synchronously switched with the drive signal.

The drive current source 24 provides the drive current 25 which, when summed with the bias current 23 flowing into the anode of VCSEL diode 22, results in the emission of the laser beam. The drive current source 24 and the bias current source 21 are designated symbolically without showing the schematic of the corresponding circuit. There are variety of well known current source designs for both discrete and integrated circuit implementations which could be used for bias current source 21 and drive current source 24.

In a laser printer, the signal used to drive the current steering circuit 20 is a binary logic signal into which is encoded the raster print data for the image to be printed. This signal, referred to as the video signal, controls the optical output of VCSEL diode 22 to selectively discharge photo-conductor drum 3 so that the latent electrostatic image is created on photo-conductor drum 3.

The video signal is connected to the input of the first inverting buffer 26. The output of first inverting buffer 26 is connected to the input of the second inverting buffer 27 to return the video signal to its original logic state. First and second inverting buffers 26-27 reducing the loading the video signal would have experienced if it were directly connected to resistor 28, thereby preserving the video signal rise and fall time. In the preferred embodiment of the current steering circuit 20, first and second inverting buffers 26, 27 selected are 74AC04 high speed CMOS devices. As one of ordinary skill in the art would recognize from this disclosure, it is possible to use other high speed logic buffers, drivers, or logic gates configured as such.

The network formed by the three resistors 28–30 creates a DC offset voltage at the cathode of second schottky diode 31. When the video signal is at a low level, the output of second inverting buffer 27 is also at a low level. For this condition, the voltage at the cathode of second schottky diode 31 is determined by the current flowing through resistor 30 and the drive current 25 flowing through the parallel combination of resistors 28, 29. When the video signal is at a high level, the output of second inverting buffer 27 is also at a high level. For this condition, the voltage at the cathode of second schottky diode 31 is determined by the current flowing from resistor 28 and resistor 30 through resistor 29.

The values of the three resistors 28–30 are selected so that the video signal a high level places second schottky diode 31 in a reversed biased state and the video signal at a low level places second schottky diode 31 in a forward biased state. When second schottky diode 31 is reversed biased, drive current 25 is steered through VCSEL diode 22. When the second schottky diode 31 is forward biased, drive current is steered through second schottky diode 31, away from VCSEL diode 22. To steer drive current 25 through VCSEL diode 22 when the video signal is at a high level, the difference between the sum of the voltages across first schottky diode 32 and VCSEL diode 22 and the voltage at the cathode of second schottky diode 31 must be less than the forward on state voltage of second schottky diode 31. To steer drive current 25 through second schottky diode 31 when the video signal is at a low level, the sum of the forward on state voltages of first schottky diode 32 and VCSEL diode 22 must be greater than the sum of the forward on state voltage of second schottky diode 31 and the voltage drop across resistor 28. Steering of the drive current 25 into VCSEL diode 22 or shunting the drive current 25 around VCSEL diode 22 could be accomplished by directly connecting the output of second inverting buffer 27 to the cathode of second schottky diode 31. However, the network formed from resistors 28–30 provides a reduction in the magnitude of the capacitive current spike resulting from switching over a direct connection from the output of second inverting buffer 27 to the cathode of second schottky diode 31. With high speed CMOS inverting buffers, the range of output voltages of first and second inverting buffers 26, 27, as the video signal switches between a high level and a low level, is the difference in the voltages applied between the positive supply and ground power connections, typically five volts. However, with the network formed from resistors 28–30 connected between the output of second inverting buffer 27 and the cathode of second schottky diode 31, this voltage swing is reduced. By reducing the magnitude of the voltage swing resulting from the switching of the video signal between a high level and a low level, the magnitude of the capacitive current coupled through the first and second schottky diodes 31, 32 is reduced.

When a diode is in a reversed biased off state condition, the capacitors associated with the reversed biased diode junction and the parasitic capacitance across the device are charged up to the voltage applied across the diode. When the video signal changes from a high state to a low state or vice versa, one of the first and second schottky diodes 30, 31 will change from the off state to the on state and the other will change from the on state to the off state. The charge stored in the capacitance associated with the one of the first and second schottky diodes 30, 31 in the off state is removed when the first and second schottky diode 31, 32 switches from the off state to the on state. By reducing the magnitude of the off state reverse bias voltage across the first and second schottky diodes, the amount of charge stored in schottky diode capacitance will be reduced, thereby reducing the magnitude of the current spike capacitively coupled through the first and second schottky diode 31, 32. The preferred embodiment of the current steering circuit 20 uses schottky diodes because of their high speed switching characteristics. One of ordinary skill in the art will recognize by understanding this disclosure that as diodes are developed with higher switching speeds than schottky diodes, they will have application in the current steering circuit 20.

Figure 4:
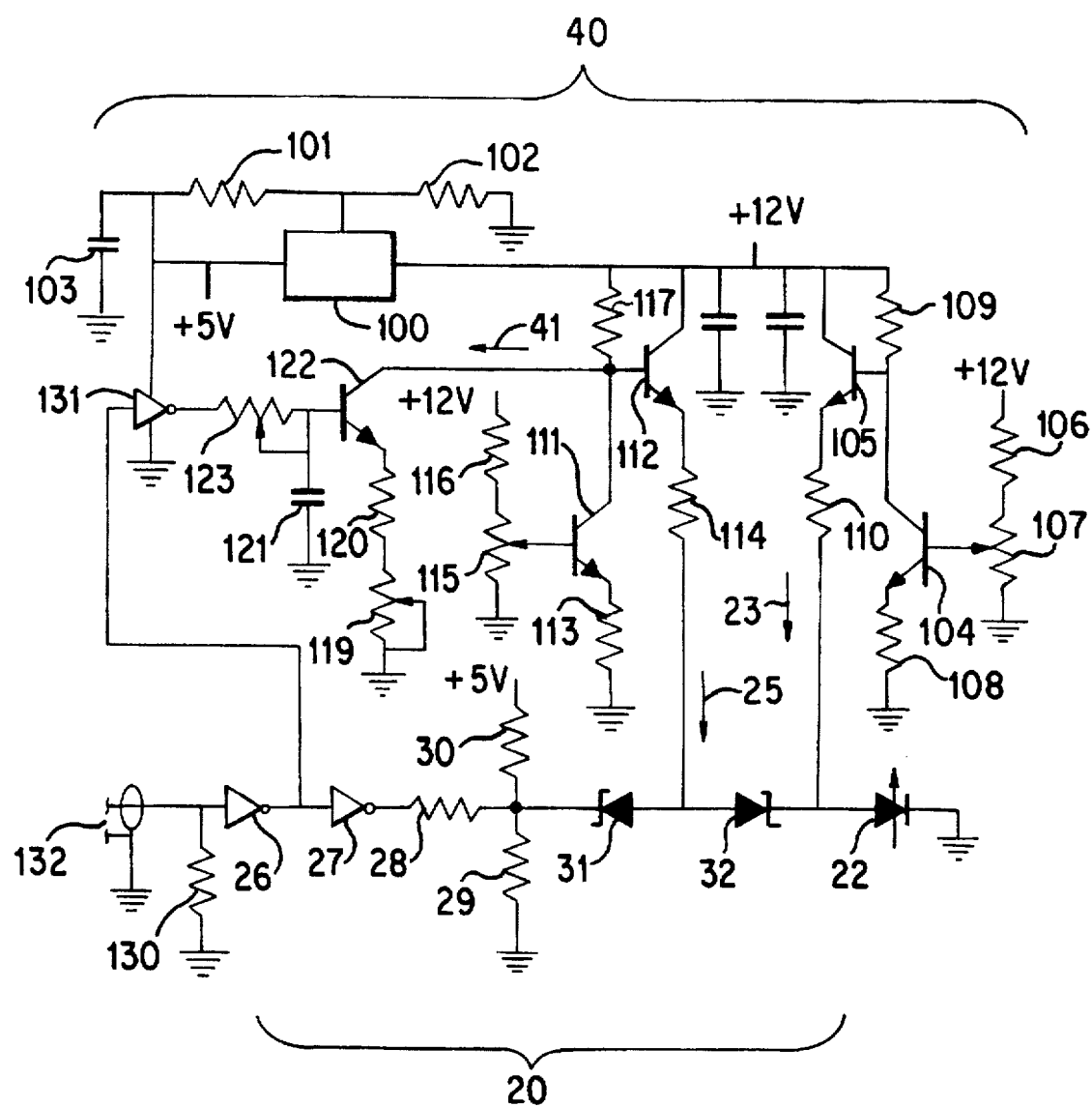
FIG. 4 is a detailed schematic of the preferred embodiment of a current steering circuit.

Shown in FIG. 4 is a detailed schematic of the preferred embodiment of the laser diode output power compensator disclosed in the co-pending application entitled: "COMPENSATION FOR LASER DIODE OUTPUT POWER VARIATION", having patent application docket number 10960126-1. Included with the laser diode output power compensator is the preferred embodiment of the current steering circuit 20. The analog portion of the laser diode output power compensator 40 is powered from a twelve volt supply (not shown). A three terminal regulator 100 is used to generate a five volt supply used to power logic gates in the laser diode output power compensator 40. As is well known for three terminal regulator circuits, resistors 101, 102 are used to set the output voltage of the three terminal regulator 100. Capacitor 103 is used for filtering the output voltage of the three terminal regulator 100 and has a typical value of 0.1 μF. Capacitors 132, 133 are used for filtering of the incoming +12 volt power supply and have typical values of 0.1 μF.

The value of bias current 23 is established by transistors 104, 105, resistors 106–110, and the forward voltage of VCSEL diode 22. Transistors 104, 105 may be any general purpose NPN transistors such as type MMBT3904 transistors. As indicated in FIG. 4, resistor 107 is of the variable type. The values of resistors 106, 108–110 are selected to set the bias current 23 so that VCSEL diode 22 is at the threshold of optical emission. Typical values for the bias current 23 in VCSEL diodes ranges from 1 mA to 2.5 mA.

The collector current of transistor 104 is essentially determined by the voltage across resistor 108 which in turn is determined by the voltage divider formed from resistors 106, 107 and the forward base-emitter voltage drop of transistor 104. The collector current of transistor 104 sets the voltage at the base of transistor 105. The bias current 23 is then determined by subtracting the forward voltage of VCSEL diode 22 and the base-emitter voltage of transistor 105 from this base voltage and dividing by the value of resistor 110.

The bias current 23 may be set manually by monitoring the optical output power of VCSEL diode 22 and adjusting resistor 107 so that the measured power of VCSEL diode 22 changes from a measurable value to substantially zero. It is possible to package the VCSEL diode 22 so that an optical output power detection device, such as a photo-diode, is located on the same package as VCSEL diode 22 and receives a portion of the output power. With this configuration the bias current 23 may be controlled by monitoring the output of the photo-diode and using this output to automatically set the bias current 23. By generating a voltage to drive the base of transistor 104 in response to the measured output of the photo-diode, the bias current may be set by lowering the base voltage of transistor 104 until the photo-diode output changes from a measurable value to substantially zero.

The value of the drive current 25 (with the compensation current 41 at a substantially zero value) is determined by transistors 111, 112, resistors 113–117, and the forward voltages of first schottky diode 32 and VCSEL diode 22. Transistors 111, 112 may be any general purpose NPN transistors such as type MMBT3904 transistors. The value of resistor 115 is variable to allow adjustment of the drive current 25. Typical values for the drive current 25 in VCSEL diodes ranges from 2 mA to 3 mA. The design process to select the component values to set the drive current at the desired value (with the compensation current 41 substantially zero) is done in a manner very similar to the design process used to set the bias current 23 and will not be repeated.

The value of compensation current 41 is determined by resistors 119, 120 and the voltage across capacitor 121. Compensation current 41 is essentially equal to the base-emitter voltage of transistor 122 subtracted from the voltage across capacitor 121 divided by the sum of the values of resistors 119, 120 (assuming the value of the base current is much smaller than the collector current for transistor 122). Transistor 122 may be any general purpose NPN transistor such as a type MMBT3904 transistor. As is indicated in FIG. 4, the value of resistor 119 is adjustable to allow the peak value of the compensation current 41 to be set at the value necessary to obtain the desired output power from VCSEL diode 22 after the video signal has been in a high state for at least five of the time constants associated with the VCSEL diode 22 output power variation. A typical value for the adjustment range for the peak value compensation current is from 0.2 mA to 2.2 mA. The value of the compensation current 41 required to achieve compensation of the VCSEL diode 20 output power varies between diodes.

The time constant of the exponential rise and decay of compensation current 41 is the same as that of the voltage across capacitor 121. This time constant is determined by the product of the values of resistor 123 and capacitor 121. When the video signal is at a high level, the output of inverter 131 is also at a high level and the voltage across capacitor 121 is increasing, thereby increasing compensation current 41. As the value of compensation current 41 increases, the voltage at the base of transistor 112 decreases. This decreased base voltage results in a reduction of drive current 25 which in turn provides compensation to maintain the output power of VCSEL diode 22 at a substantially constant value during the time in which the video signal is at a high level.

First and second schottky diodes 31, 32 and the bias network formed from resistors 28–30 steer drive current 25 into VCSEL diode 22 or steer drive current 25 to ground based upon the output of buffer inverter 27. When the video signal is at a high level the output of buffer inverter 26 is at a low level and the output of buffer inverter 27 is at a high level. As a result, the voltage at the common connection point of resistors 28–30 is sufficiently high to hold second schottky diode 31 in the off state thereby steering drive current 25 through VCSEL diode 22. When the video signal is at a low level the output of inverter 27 is also at a low level and the voltage at the common connection point of resistors 28–30 is sufficiently low to forward bias second schottky diode 31 thereby steering drive current 25 to ground without flowing through VCSEL diode 22. The values of resistors 28–30 are selected to ensure that first and second schottky diodes 31, 32 will be rapidly switched between the off state and the on state as the video signal changes between a high level and a low level. In the preferred embodiment of the current circuit 20, the value of resistor 28 is 240 ohms, the value of resistor 29 is 160 ohms, and the value of resistor 30 is 270 ohms. With a five volt power source applied to first and second inverting buffers 26, 27 and to the end of resistor 30 not connected to resistors 28, 29, the range of the voltage swing between the video signal at a high state and a low state is centered about the forward on state voltage of the VCSEL diode 22. Resistor 130 is selected to provide proper termination for the video signal driving inverter 26. The video signal is connected at input 132.

Figure 5:
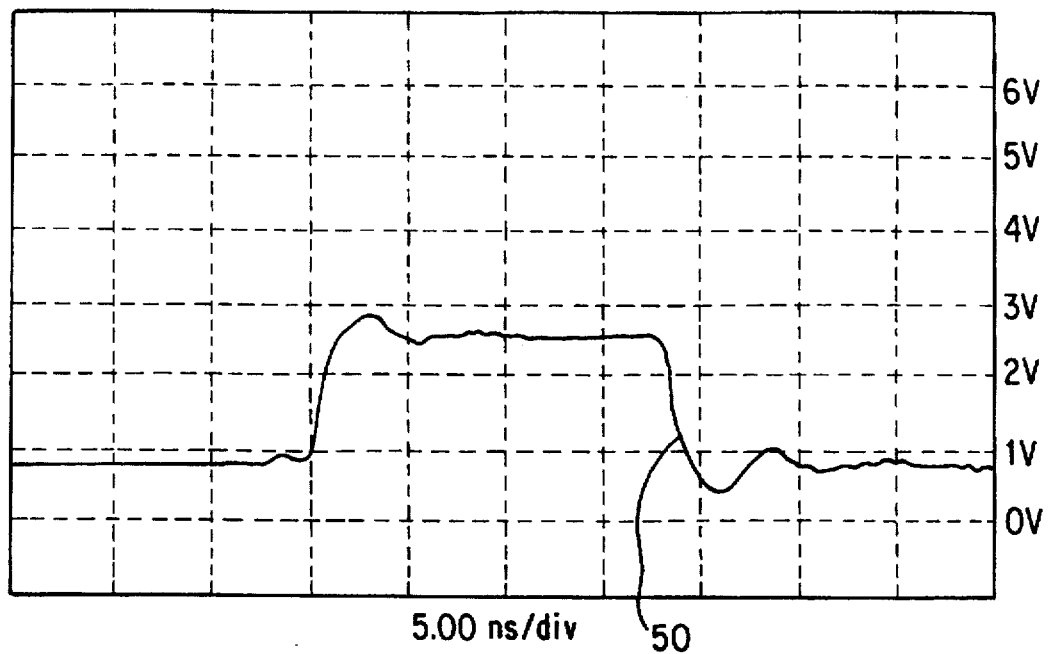
FIG. 5 is a measured voltage waveform at a node in the preferred embodiment of the current steering circuit.

Shown in FIG. 5 is a measured waveform 50 of the voltage at the cathode of second schottky diode 31 using the preferred embodiment of the current steering circuit 20. With the network formed by resistors 28–30, the swing in the output of second inverting buffer 27 is converted from a 0 volt to 5 volt range to a 0.8 volt to 2.5 volt range. As mentioned previously, reduction in the voltage swing reduces the magnitude of the capacitively coupled current spike through first and second schottky diodes 31, 32.

Figure 6:
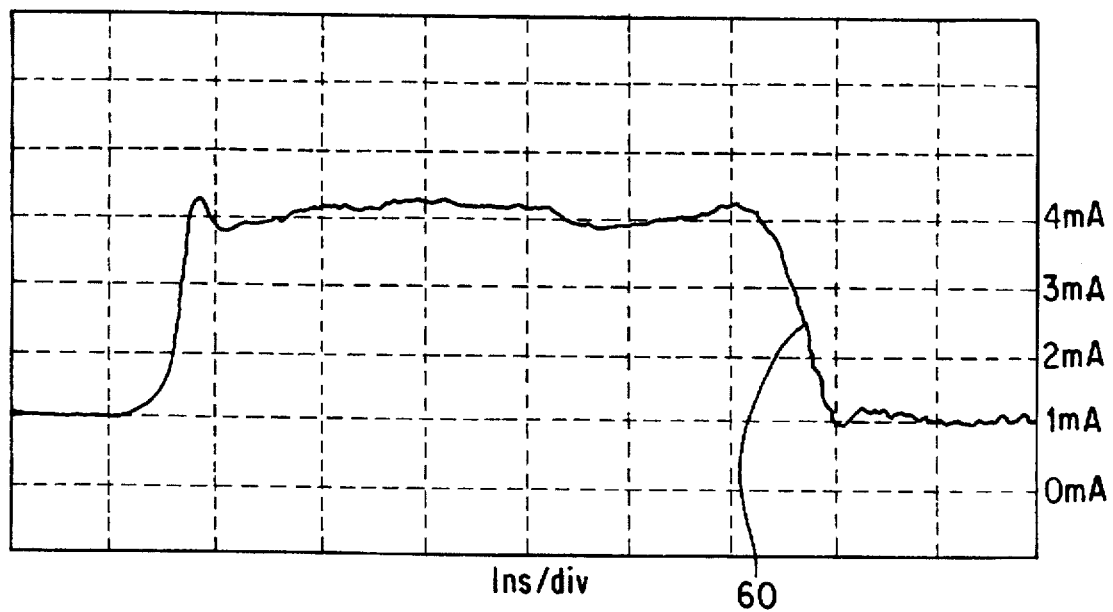
FIG. 6 is a measured forward current waveform of the VCSEL diode in the preferred embodiment of the current steering circuit.

Shown in FIG. 6 is the waveform 60 of the forward current through VCSEL diode 22 when drive current 25 is steered into the anode of VCSEL diode 22. The measured rise time of the VCSEL diode 22 forward current is 320 picoseconds. The measured fall time of the VCSEL diode 22 forward current is 540 pico-seconds.

Figure 7:
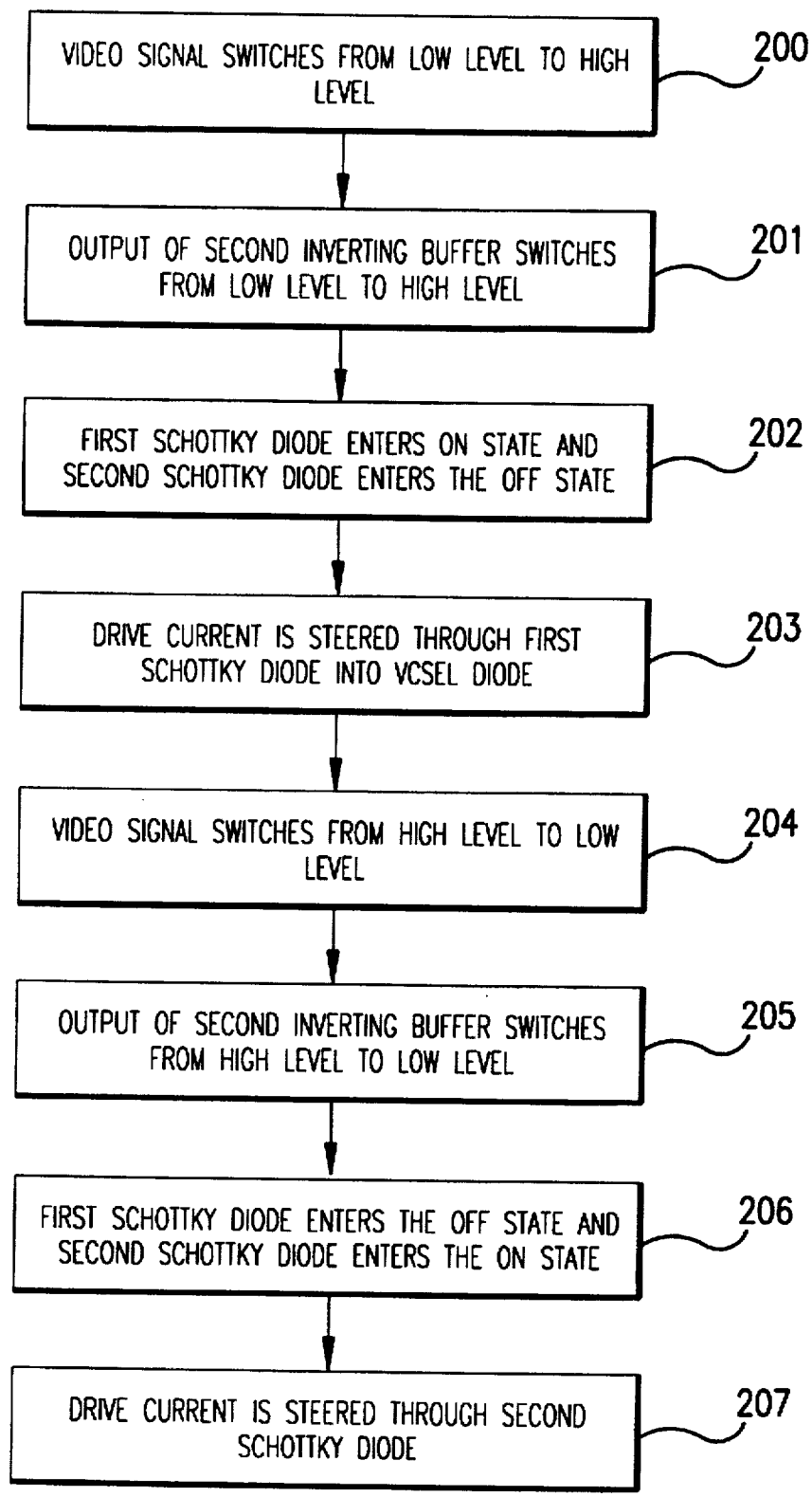
FIG. 7 is a flow diagram of a method for using the preferred embodiment of the current steering circuit.

FIG. 7 illustrates the method of operation of the preferred embodiment of the current steering circuit 20 to accomplish high speed switching of the VCSEL diode 22. Assume that, initially, the current steering circuit 20 is in the state which steers the drive current 25 through second schottky diode 31. For this state, the output of second inverting buffer 27 is at a low level. First, the video signal switches 200 from a low level to a high level. Then, several nano-seconds later the output of second inverting buffer 27 switches 201 from a low level to a high level. Next, second schottky diode 31 enters 202 the off state and first schottky diode 32 enters 202 the on state. Drive current 25 is then steered 203 through first schottky diode 32 into the anode of VCSEL diode 22. When the video signal switches 204 from a high level to a low level, the output of second inverting buffer 27 switches 205 to a low level several nano-seconds later. Then, first schottky diode 32 enters 206 the off state and second schottky diode 31 enters 205 the on state. Drive current 25 is then steered 207 through second schottky diode 31 to ground.

Although several embodiments of the invention have been illustrated, and their forms described, it is readily apparent to those of ordinary skill in the art that various modifications may be made therein without departing from the spirit of the invention or from the scope of the appended claims.

What is claimed is:

1. A circuit for steering a current, responsive to a signal source, into and around a load having a first terminal and a second terminal, said circuit comprising:

a first diode having a first anode and a first cathode, said first cathode connected to said first terminal of said load;

a second diode having a second anode and a second cathode, said second anode coupled to said first anode defining a first node, said current for flowing into said first node;

a first resistor connected between said second cathode and said second terminal of said load;

a second resistor connected between said second cathode and a predetermined voltage; and a third resistor connected between said second cathode and said signal source.

2. The circuit as recited in claim 1, further comprising:

a buffer connected between said signal source and said third resistor.

3. The circuit as recited in claim 2, wherein:

said buffer includes a first inverting buffer connected to a second inverting buffer with an input of said first inverting buffer connected to said signal source and an output of said second inverting buffer connected to said third resistor.

4. The circuit as recited in claim 3, wherein:

said load includes a laser diode.

5. The circuit as recited in claim 4, wherein:

said laser diode consists of a vertical cavity surface emitting laser diode.

6. The circuit as recited in claim 5, wherein:

said first and said second diode each consist of a schottky diode.

7. The circuit as recited in claim 6, wherein:

said first and said second inverting buffer each consist of a high speed CMOS inverter.

8. The circuit as recited in claim 7, wherein:

said current includes a drive current.

9. The circuit as recited in claim 8, further comprising:

a bias current source coupled to said first terminal of said vertical cavity surface emitting laser diode.

10. A photo-conductor drum exposure system, comprising:

a laser diode having a first anode and a first cathode;

a signal source connected to said first cathode;

a drive current source for providing a drive current to said laser diode;

a circuit for steering said drive current into said laser diode responsive to said signal source, said circuit including a first diode having a second anode and a second cathode, said second cathode connected to said first anode, a second diode having a third anode and a third cathode, said third anode coupled to said second anode defining a first node, said drive current source coupled to said first node, a first resistor connected between said third cathode and said first cathode, a second resistor connected between said third cathode and a predetermined voltage, and a third resistor connected between said third cathode and said signal source.

11. The photo-conductor drum exposure system as recited in claim 10, wherein:

said signal source includes a buffer connected to said third resistor.

12. The photo-conductor drum exposure system as recited in claim 11, wherein:

said buffer includes a first inverting buffer connected to a second inverting buffer with an output of said second inverting buffer connected to said third resistor.

13. The photo-conductor drum exposure system as recited in claim 12, wherein:

said laser diode consists of a vertical cavity surface emitting laser diode.

14. The photo-conductor drum exposure system as recited in claim 13, wherein:

said first and said second diode each consist of a schottky diode.

15. The photo-conductor drum exposure system as recited in claim 14, wherein:

said first and said second inverting buffer each consist of a high speed CMOS inverter.

16. The photoconductor drum exposure system as recited in claim 13, further comprising:

a bias current source coupled to said first anode.

* * * * *